United States Patent [19]

Lal et al.

[11] Patent Number: 5,693,198
[45] Date of Patent: Dec. 2, 1997

[54] METHOD OF PRODUCING A MAGNETIC RECORDING MEDIUM

[75] Inventors: Brij Bihari Lal, San Jose, Calif.; Tadashi Shinohara, Ibaraki, Japan

[73] Assignee: HMT Technology Corporation, Fremont, Calif.

[21] Appl. No.: 372,661

[22] Filed: Jan. 13, 1995

Related U.S. Application Data

[63] Continuation-in-part of Ser. No. 41,943, Apr. 2, 1993, Pat. No. 5,580,667, which is a continuation-in-part of Ser. No. 907,774, Jun. 30, 1992, Pat. No. 5,432,012, and Ser. No. 995,879, Dec. 23, 1992, Pat. No. 5,356,522.

[51] Int. Cl.[6] ................................................. C23C 14/34
[52] U.S. Cl. ........................ 204/192.2; 204/192.15; 204/192.12
[58] Field of Search ................ 204/192.12, 192.15, 204/192.2, 298.12, 298.26, 298.16, 298.17, 298.18, 298.19

[56] References Cited

U.S. PATENT DOCUMENTS

| | | | |
|---|---|---|---|
| 4,488,956 | 12/1984 | Scherer et al. | 204/298.12 |
| 4,569,746 | 2/1986 | Hutchinson . | |
| 4,626,336 | 12/1986 | Bloomquist et al. | 204/298.12 |
| 4,654,276 | 3/1987 | Ahlert et al. | 204/192.2 |
| 4,677,032 | 6/1987 | Robinson | 360/134 |
| 4,761,218 | 8/1988 | Boys | 204/192.2 |
| 4,776,938 | 10/1988 | Abe et al. | 204/192.2 |
| 5,324,593 | 6/1994 | Lal et al. | 428/610 |
| 5,512,150 | 4/1996 | Bourez et al. | 204/192.2 |

OTHER PUBLICATIONS

Cord, B., et al., "Sputtering of High Coercivity/Low Noise CoCrTa Bilayered Hard Disks in Production of System," *IEEE Trans. Magn.* 29(6): 3694 (1993).

Ranjan et al. "Magnetic, recording and crystalline properties of multilayered longitudinal thin-film media" *J. Appl. Phys.* 69(8), 15 Apr. 1991 4727–4729.

*Primary Examiner*—R. Bruce Breneman
*Assistant Examiner*—Rodney G. McDonald
*Attorney, Agent, or Firm*—Judy M. Mohr; Peter J. Dehlinger

[57] ABSTRACT

A method for forming a magnetic recording medium having a chromium underlayer and a magnetic recording layer is described. The method includes sputtering the underlayer and the magnetic layer in a single sputtering chamber from a two-region target having an inner chromium region and an outer magnetic region. Each target region is successively energized for sputter deposition of each layer.

10 Claims, 4 Drawing Sheets

METHOD OF PRODUCING A MAGNETIC RECORDING MEDIUM

This application is a continuation-in-part of U.S. patent application for "Multilayered Medium with Gradient Isolation Layer" Ser. No. 08/041,943, filed Apr. 2, 1993 now U.S. Pat. No 5,580,667, which is a continuation-in-part of U.S. patent applications for "Thin-Film Medium with Compositional Gradient", Ser. No. 07/907,774, filed Jun. 30, 1992 now U.S. Pat No. 5,432,012, and for "Thin-Film Medium with Chromium Underlayer Gradient", Ser. No. 07/995,879, filed Dec. 23, 1992 now U.S. Pat. No. 5,356,522.

FIELD OF THE INVENTION

The present invention relates to an improved method of forming a magnetic recording medium. The method includes sputtering an underlayer and a magnetic recording layer from a single, two-region target placed in a sputtering chamber. Each of the two target regions is successively energized for sputter deposition.

References

Cord, B., et al., *IEEE Trans. Magn.*, 29(6):3694 (1993).
Kogure, T., *J. Appl. Phys.*, 67(9):4701 (1990).

BACKGROUND OF THE INVENTION

Thin film magnetic recording media are widely used in read\write memory devices in computers. Increasingly, there is an effort in the thin-film medium industry to achieve higher recording density, and among the magnetic properties which are important to a high recording density is coercivity.

Coercivity is defined as the magnetic field required to reduce the remanence magnetic flux to zero, i.e., the field required to erase a stored bit of information. Higher coercivity in a medium allows adjacent recorded bits to be placed more closely together without mutual cancellation. Thus, higher coercivity is associated with higher information storage density.

Magnetic recording media are commonly fabricated by sequentially sputtering onto a substrate an underlayer and a magnetic thin-film layer. A protective, wear-resistant overcoat may also be sputtered. Typically, the uncoated substrate is preheated in a heating chamber, and the layers are then deposited, one after the other, in a series of separate sputtering chambers.

The preheated substrate cools during the dwell time between start of deposition in one chamber and the start of deposition in the next chamber. It has been found that a nickel-plated aluminum substrate preheated to 300° C., cools at a rate of 33° C./min (Cord). Thus, longer dwell times result in cooler substrates, and each successive layer is deposited at a lower substrate temperature than the previous layer.

The temperature at which sputtering occurs affects the magnetic properties of the medium, and it has been shown that a higher sputtering temperature during deposition of the magnetic layer results in a medium with a higher coercivity (Kogure, Cord).

SUMMARY OF THE INVENTION

Accordingly, it is an object of the invention to provide a method for sputtering an underlayer and a magnetic recording layer onto a substrate that minimizes the dwell time.

It is another object of the invention to provide a method of forming a magnetic recording medium having an improved coercivity.

In one aspect, the invention includes an improvement in a method for forming a magnetic recording medium, by successively sputtering onto a substrate from a nonmagnetic target in a first deposition station and from a magnetic alloy target in a second deposition station. The improvement, which is effective to achieve enhanced coercivity of the medium, includes (1) placing the substrate in a deposition station having a single, two-region target formed of an inner, nonmagnetic region and an outer, magnetic alloy region; (2) sputtering an underlayer onto the substrate by energizing the inner target region; and (3) with the substrate in the same deposition station, sputtering a magnetic layer onto the substrate by energizing the outer target region.

The sputtering steps are accomplished by applying a direct current (DC) voltage, in the presence of a magnetic field, successively to each of the two target regions. That is, the DC voltage is first applied to the inner target region, and then to the outer target region. Alternatively, the sputtering steps are accomplished by applying a (radio frequency) RF signal successively to each of the two target regions.

In one embodiment, the sputtering steps are from a single, two-region target having an inner, circular chromium region and an outer, annular cobalt-based magnetic alloy region, such as CoCrTa. Sputtering is accomplished by applying a DC voltage, in the presence of a magnetic field, successively to each of the two target regions.

Sputtering from the inner region is effective to deposit a chromium underlayer to a thickness of between 50 and 750 Å. Sputtering from the outer target region is effective to deposit a magnetic recording layer to a thickness of between 50 and 400 Å.

These and other objects and features of the invention will be more fully appreciated when the following detailed description of the invention is read in conjunction with the accompanying drawings.

BRIEF DESCRIPTION OF THE DRAWINGS

FIG. 2A is a plane view of the target and FIGS. 2B and 2C are cross sectional views of two embodiments of the target;

DETAILED DESCRIPTION OF THE INVENTION

Section I below describes a sputtering apparatus having a single, two-region target in a selected sputtering chamber of the apparatus for use in forming a magnetic recording medium in accordance with the invention. The magnetic recording properties of media so formed are described in Section II.

I. Method of the Invention

Figure 1:
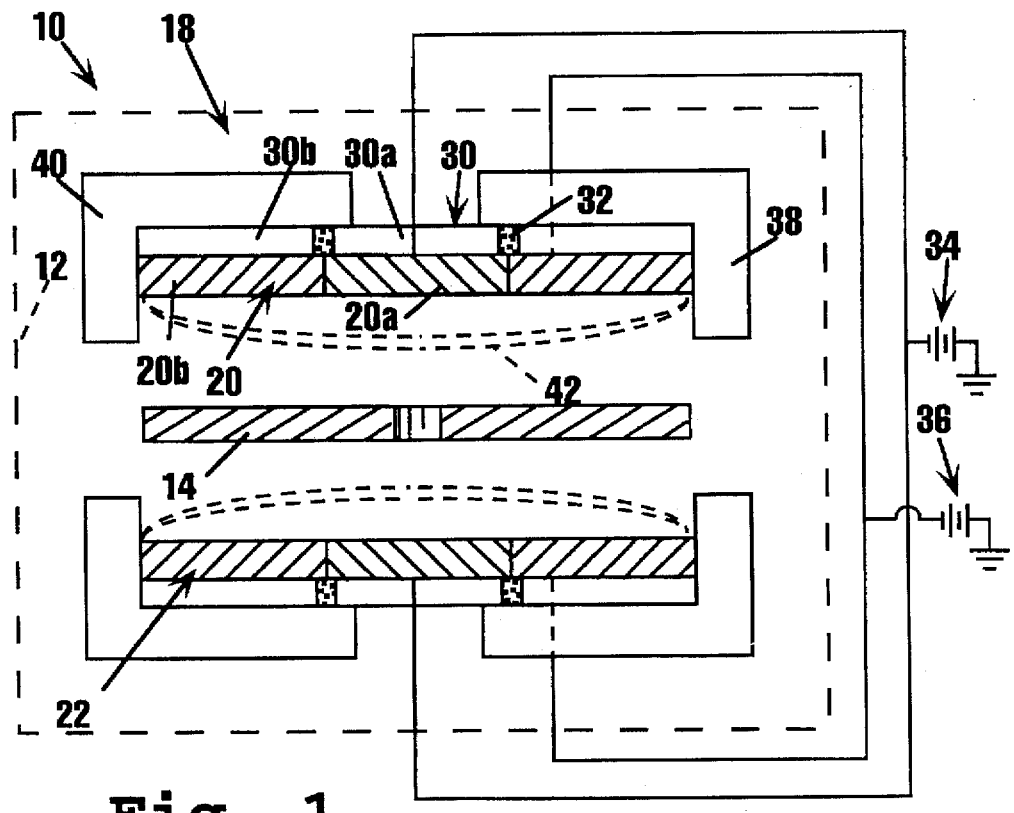
FIG. 1 is a schematic view of a sputtering station in a sputtering apparatus used in forming a magnetic recording medium in accordance with the present invention.

FIG. 1 shows, in schematic view, a portion of a sputtering apparatus 10 which has been modified for sputtering from a single, two-region target, as will be described. The apparatus includes a vacuum chamber, indicated by dotted lines at 12, having at least four stations at which sputtering or heating operations occur. A heating station (not shown) at the upstream end of the chamber has a plurality of infrared lights which are arrayed for heating both sides of a substrate, such as substrate 14, carried through the station in the chamber on a tray (not shown). The substrate, or disc, is supported on the tray for sputtering on both sides of the substrate, as shown.

Downstream of the heating station is one or more deposition, or sputtering, stations, such as station 18 shown in the figure, at which thin-film media layers are deposited on the substrate.

Sputtering station 18 includes a pair of sputtering targets, 20, 22 for deposition on upper and lower sides of the substrate, respectively. Target 20, which is representative, is a two-region target composed of an inner, target portion 20a, and an outer, target portion 20b which surrounds the inner region.

Figure 2A:
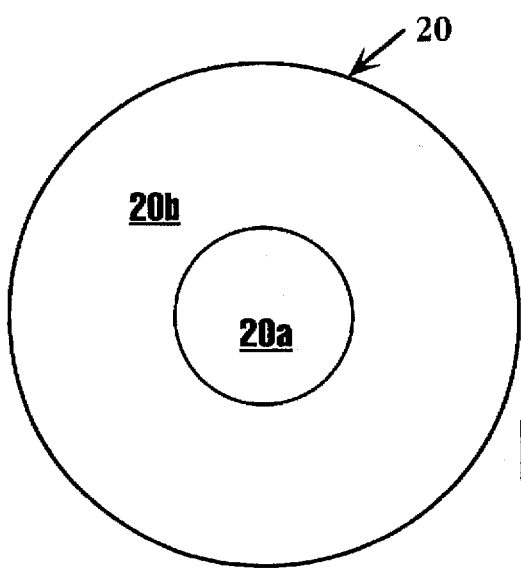
FIGS. 2A–2C are views of the two-region sputtering target for use in the apparatus of FIG. 1, where

In one embodiment, the two-region target is composed of an inner, circular region and an outer, annular surrounding portion, as seen best in FIG. 2A. It will be appreciated that the target may be of another geometry, such as rectangular or oblong, where an inner region is surrounded by an outer region.

The inner target portion is preferably composed of a nonmagnetic material such as chromium or a chromium-based alloy, such as CrGd, CrV, or CrSi. The outer target portion is preferably composed of a magnetic alloy, and more preferably composed of a cobalt-based magnetic alloy, such as CoCrTa. Other suitable cobalt-based alloys are described below.

Figure 2B:
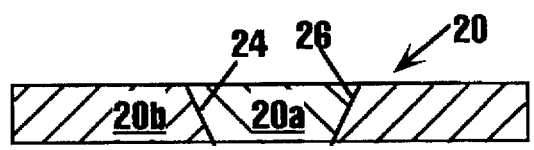
Figure 2C:
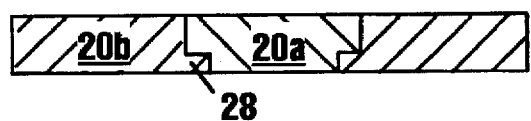

As seen in FIG. 2B, which shows the target in cross sectional view, the two target regions are joined along abutting faces 24, 26 to form a single, unitary target. In order to facilitate adhesion during manufacture, faces 24, 26 can be angled, as shown in FIG. 2B. Alternatively, the joining faces may be segmented, as shown in FIG. 2C. Here, inner portion 20a is notched such that it rests on segment 28 of outer portion 20b.

Typically, the inner portion of the target has a diameter of between about 5 and 7 cm. The outer portion of the target has an outer diameter of between about 7 and 16 cm. It will be appreciated that the relative dimensions of each target portion can be varied as desired.

With reference again to FIG. 1, target 20 is mounted on a plate 30 which is composed of two annular plate portions 30a, 30b which support the corresponding inner and outer portions of target 20, respectively, and which are separated by an insulating ring 32. The two plate portions are connected to separate DC power supplies, indicated at 34, 36, for applying selected voltages between the respective target portions and the substrate, in a manner to be described.

In another embodiment, the two plate portions are connected to separate RF power sources, which includes a conventional RF generator for producing a selected-alternating-current voltage in the range preferably between about 400–2,000 RMS volts, at a preselected frequency, preferably 450 KHz or 13.56 MHz.

Although the sputtering process can be carried out solely in an electric field, substantially increased deposition rates are possible with magnetron sputtering in which an arched magnetic field, formed in a closed loop over the surface of the sputtering target, is superimposed on the electric field. The plate and target are bounded by opposite magnetic poles 38, 40, which act to set up magnetic field lines, such as indicated by dotted lines 42, across the surface of the target. The magnetic poles may be associated with permanent or electromagnets.

A typical sputtering apparatus that can be modified for purposes of the invention include those available from various sources, such as Circuits Processing Apparatus (Fremont, Calif.), Leybald Heraeus (Germany), VACTEK (Boulder, Colo.), Materials Research Corp (Albany, N.Y.), Varian/Intervac (Santa Clara, Calif.) or Anelva (Japan). These systems are all double-sided, in-line, high-throughput machines having two interlocking chambers for loading and unloading.

The sputtering process is carried out by energizing successively each of the targets portions by applying a DC voltage in the presence of the magnetic field. For example, for deposition of a chromium underlayer and a magnetic recording layer onto a substrate, the inner, chromium target region is activated by applying DC voltage. The DC voltage applied between the inner target portion and substrate is between −100 to −1,000 volts, and preferably between about −300 and −700 volts. The sputtering rate for deposition of material from the inner target region onto the substrate is controlled by adjusting the sputtering time, the applied voltage, and other process parameters.

Following sputter deposition from the inner target region, the outer target portion is energized for deposition of material, such as a magnetic alloy, from the outer target portion onto the coated substrate. The outer target region is preferably energized from a second power source, although the power source for activating the inner target region can be employed to activate the outer target region. The DC voltage applied across the outer target portion is between about −50 to −1,000 volts, and preferably between about −100 and −700 volts. The sputtering rate is controlled by adjusting process parameters, as described above with respect to deposition of material from the inner target region.

Figure 3:
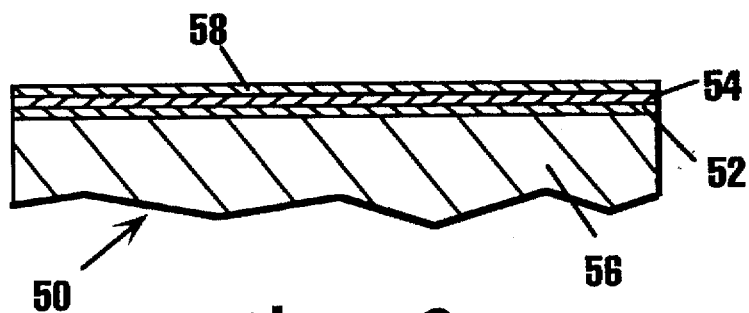
FIGS. 3 is a sectional view of a thin-film medium formed in accordance with the method of the invention.

FIG. 3 shows, in cross sectional view, a fragmentary portion of a thin-film medium 50 having a crystalline underlayer 52 and a magnetic recording layer 54, formed using the single, two-region target described above. The layers are deposited on a rigid disc-like substrate 56. The medium may also include a protective overcoat 58.

The substrate may be a metallic material, such as conventional surface-coated, textured aluminum substrate of the type used commonly for digital recording medium. Alternatively, the substrate may be composed of a nonmetallic material, such as textured glass, glass-ceramic, carbon, silicon nitride, heat-resistant polymer, or ceramic.

The sputtered crystalline underlayer is preferably a sputtered chromium underlayer having a thickness between about 10–2,000 Å, preferably between about 50–750 Å, more preferably between about 100–600 Å. Chromium-containing alloys, such as CrV, CrGd and CrSi may also be suitable underlayer materials, as may be a tungsten underlayer.

The magnetic thin-film layer is preferably a cobalt-based alloy, that is an alloy containing at least 50% cobalt, and is formed directly on the underlayer. Exemplary thin-film alloys include binary alloys and ternary alloys, such as Co/Cr, Co/Ni, Co/Cr/Ta, Co/Ni/Pt, or Co/Cr/Ni, and quaternary and five-element alloys, such as Co/Ni/Cr/Pt, Co/Cr/Ta/Pt, Co/Cr/Ta/Pt/B, or Co/Cr/Ni/Pt/B. In one embodiment, the magnetic layer is composed of a Co/Cr/Ta alloy containing 80–90 atomic percent cobalt, 5–15 atomic percent chromium, and 1–10 atomic percent tantalum. The magnetic recording layer is deposited to a thickness of between about 25–1,000 Å, preferably between about 50–400 Å, more preferably between about 100–300 Å.

According to an important feature of the invention, underlayer 52 and magnetic recording layer 54 are sputtered onto the substrate from a single, two-region target placed in a single deposition station, where each target region is successively energized for sputter deposition.

The overcoat in the magnetic recording medium is formed by sputter deposition onto the magnetic recording layer. The overcoat may be composed of carbon, silicon oxide, silicon nitride, or other suitable material giving wear-resistant, protective properties to the medium.

Figure 4A:
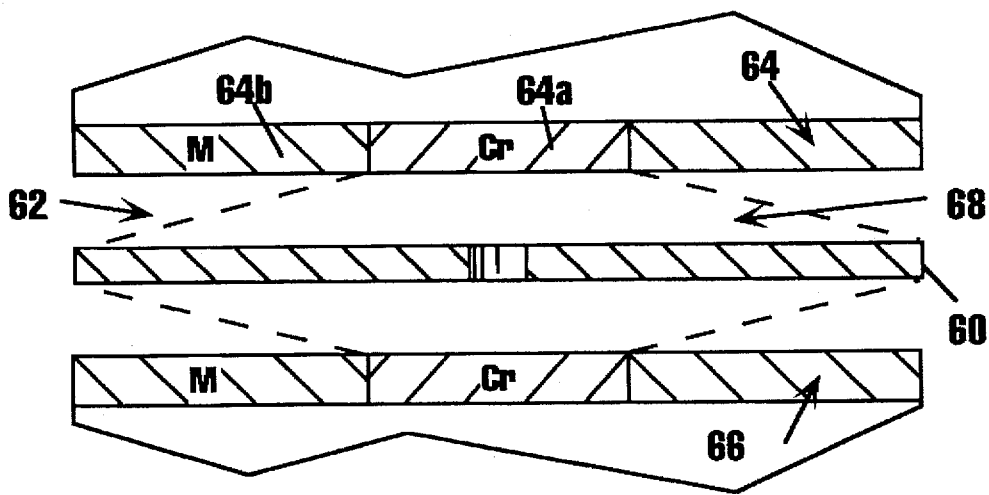
FIGS. 4A and 4B illustrate sputter deposition from the two-region target, in accordance with the method of the invention.
Figure 4B:
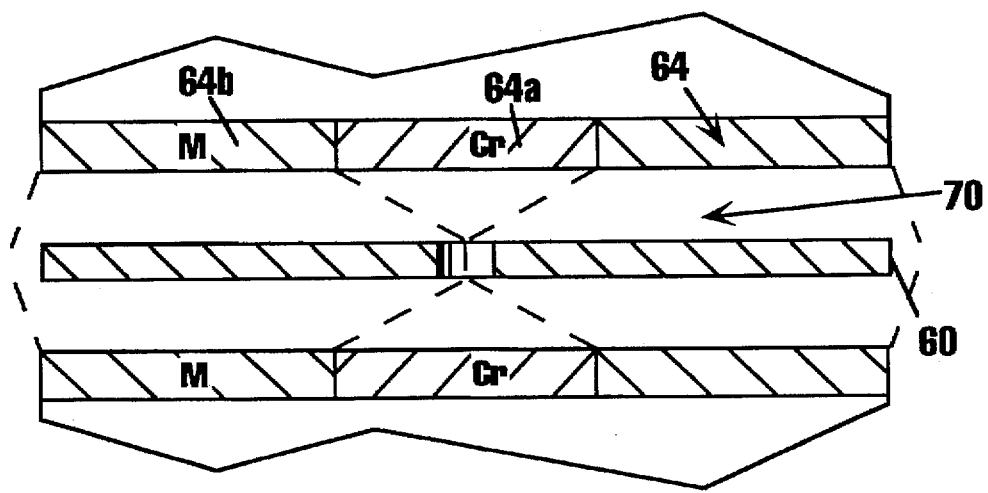

FIGS. 4A and 4B illustrate the process of forming a chromium underlayer and a magnetic recording layer, as part of the production of a thin-film medium, from a single, two-region target placed in a sputtering chamber, like that shown in FIG. 1.

FIG. 4A illustrates a substrate 60 positioned in a deposition station 62 between single, two-region targets 64, 66. Target 64, which is representative, is formed of a chromium, inner region 64a and a cobalt-based magnetic alloy outer region 64b. Downstream of station 62 is a heating chamber (not shown), where substrate 60 is preheated. The preheated substrate enters deposition station 62, and the inner, chromium target region is energized from a first DC power supply, as described with respect to FIG. 1. Chromium is sputtered from the inner target region, creating a zone 68, where sputtered material is deposited onto substrate 60. In this manner, a chromium underlayer is sputtered onto the substrate.

After deposition of the chromium underlayer, the power to the inner target region is turned off. With the chromium-coated substrate remaining in deposition station 62, the outer, magnetic target region is energized by applying a DC voltage, in the presence of a magnetic field, to the target from a second DC power supply. Material, such as a cobalt-based alloy, is sputtered from the outer target portion, creating sputtering zone 70, where material is deposited onto the chromium-coated substrate. In this way, a magnetic recording layer is deposited onto the chromium underlayer.

It will be appreciated that one or more cycles of successive sputtering can be performed. A multi-layered medium having two or more magnetic recording layers separated by chromium interlayers can be formed by repeatedly sputtering from the inner, chromium target region and the outer, magnetic target region.

Importantly, the method of the invention, where the underlayer and the magnetic recording layer are sputtered in the same deposition station reduces the dwell time. Magnetic media are conventionally formed by successively sputtering onto a substrate from a target in a first deposition station and from a magnetic alloy target in a second deposition station. The dwell time includes the sputtering time in the first station and the transfer time to the second station. The method of the present invention eliminates the transfer time, thereby reducing the dwell time.

As discussed above, prior to deposition of the underlayer, the substrate is preheated in a heating station. During sputtering of each layer, the substrate cools and a shorter dwell time provides a means of sputtering at a higher substrate temperature, which is beneficial to magnetic recording properties, in particular coercivity.

II. Magnetic Recording Properties

Magnetic recording media having a chromium underlayer and a CoCrTa (84.5/12.5/3.0) magnetic recording layer were formed in accordance with the method of the invention, described above. Magnetic properties of the media were measured conventionally.

Table 1 shows the static magnetic properties of media formed in a single sputtering chamber from a single, two-region target, as described above. For comparison, a medium was formed conventionally, where the chromium underlayer and the magnetic recording layer were deposited in separate sputtering chambers from two separate targets.

TABLE 1

| Magnetic Properties | 2-Chamber Process (Control) | 1-Chamber Process |
|---|---|---|
| Cr-Underlayer Thick. | 550 A | 380 A |
| Substrate Bias | −500 V | −500 V |
| Coercivity | 2326 Oe | 2785 Oe |
| Squareness-Ratio (Mr/Ms) | 0.85 | 0.91 |
| Coercive-Squareness (S*) | 0.82 | 0.78 |
| Orientation-Ratio (OR) | 1.42 | 1.42 |
| Mrt (Gauss. Microns) | 122 | 119 |

As can be seen, the medium formed in accordance with the method of the invention in using a single, two-region target in one sputtering chamber (1-chamber process) has a 20% higher coercivity than the medium formed conventionally in a two-chamber sputtering process (2-chamber process). The improved coercivity is achieved with no significant change in other properties, such as coerciveness squareness and orientation ratio.

Table 2 shows the parametrics for a medium formed in the conventional two-chamber process (2-chamber) and for two media formed using the one-chamber process of the present invention (1-chamber). A 16% improvement in coercivity was achieved by forming the medium in a single deposition station using a two-region target. Other parameters, such as signal amplitude, signal-to-noise ratio, were slightly improved for the media formed in the one-chamber process.

TABLE 2

| Process | Coercivity (Oe) | Mrt (Gum) | HF (uV) | Res. (%) | OW (-dB) | PW50 (ns) | BS (ns) | DC-SNR (dB) |
|---|---|---|---|---|---|---|---|---|
| ID: R = 0.78" (HF: 11.2 MHz) | | | | | | | | |
| 2-Chamber | 1800 | 280 | 262 | 74.1 | 37.5 | 60.3 | 11.2 | 27.0 |
| 1-Chamber | 2281 | 258 | 269 | 81.9 | 34.2 | 56.8 | 9.6 | 27.5 |
| 1-Chamber | 2089 | 288 | 290 | 79.6 | 35.9 | 58.2 | 10 | 28.2 |
| OD: R = 1.77" (HF: 18 MHz) | | | | | | | | |
| 2-Chamber | 1800 | 280 | 493 | 97.5 | 27.4 | 32.3 | 2.2 | 28.6 |
| 1-Chamber | 2281 | 258 | 492 | 97.0 | 23.3 | 32.2 | 2.2 | 28.6 |
| 1-Chamber | 2089 | 288 | 525 | 95.4 | 23.4 | 32.8 | 2.1 | 29.1 |

Figure 5:
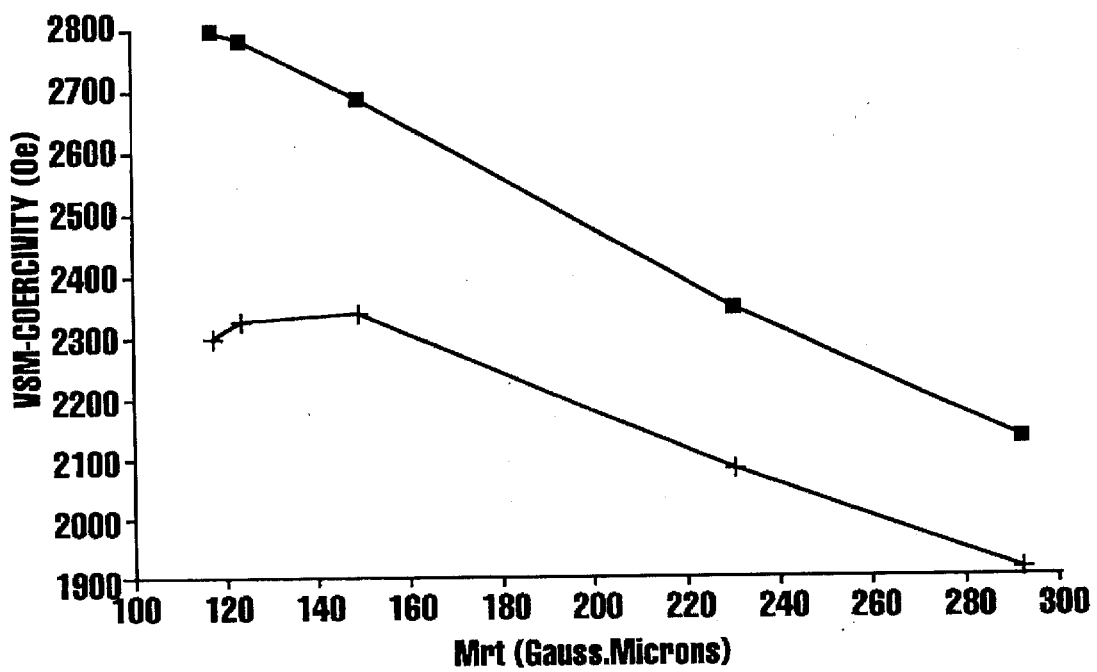
FIG. 5 is a plot of coercivity, in Oe, as a function of magnetic remanence thickness product (M,t), in Gauss-microns, for media formed conventionally (+) and from the single, two-region target in accordance with the method of the invention (■)

FIG. 5 is a plot of coercivity, in Oe, as a function of magnetic remanence thickness product (M,t), in Gauss-microns, for media formed with a chromium underlayer and a CoCrTa magnetic recording layer. Media formed conventionally where the underlayer and the magnetic recording layer are deposited in separate sputtering chambers from two separate targets (+) are compared to media having a chromium underlayer and a magnetic recording layer formed in a single sputtering chamber from a single, two-region target in accordance with the method of the invention (■). As can be seen, the coercivity of the media having a chromium underlayer and magnetic recording layer formed from the two-region target have a higher coercivity over the range of magnetic remanence thickness.

Figure 6:
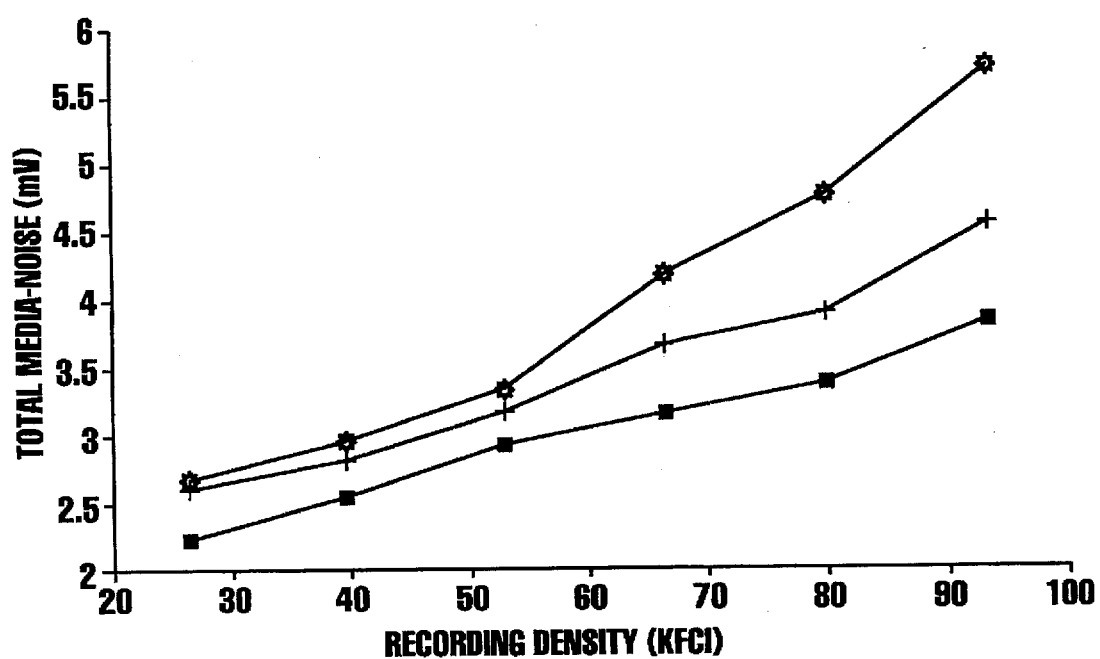
FIG. 6 is a plot of total media noise, in mV, as a function of recording density, in kiloflux changes/inch (KFCI), for media formed conventionally (*) and from the single, two-region target in accordance with the method of the invention (■, +)
Figure 7:
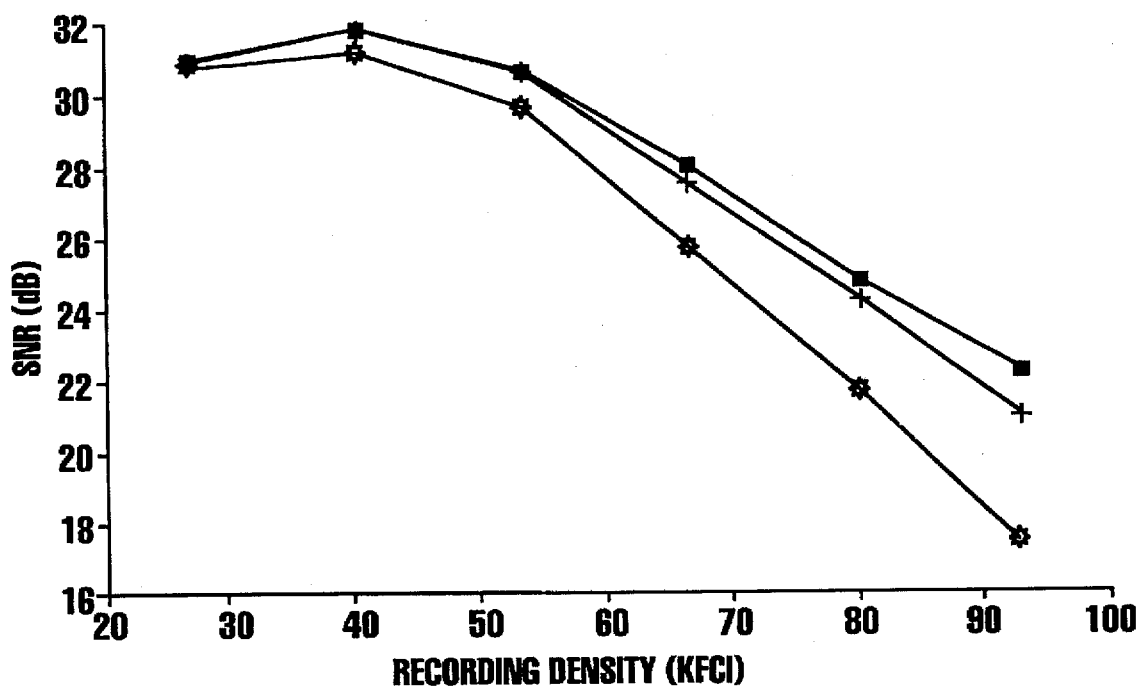
FIG. 7 is a plot of signal-to-noise ratio, in dB, as a function of recording density, in kiloflux changes/inch (KFCI), for media formed conventionally (*) and from the single, two-region target in accordance with the method of the invention (■, +).

FIGS. 6 and 7 are plots of total media noise (FIG. 6) and signal-to-noise ratio (FIG. 7) as a function of recording density, in kiloflux changes/inch (KFCI). Media formed conventionally (described above) (*) and having a magnetic remanence thickness of 280 Gauss-microns are compared to media formed from the single, two-region target in accordance with the method of the invention and having magnetic remanence thicknesses of 258 Gauss-microns (■) and 280 Gauss-microns (+).

As seen in FIG. 6, the total media noise of the media having a chromium underlayer and a CoCrTa magnetic recording layer formed using a single, two-region target have a lower media noise over the range of recording density tested.

FIG. 7 shows that the signal-to-noise ratio is higher for media formed in accordance with the invention over the recording density range tested.

From the foregoing, it can be appreciated how various features and objects of the invention are met. Magnetic recording media are formed by sputtering a nonmagnetic underlayer and a magnetic recording layer onto a substrate, where each layer is sputtered in a deposition station having a single, two-region target formed of an inner chromium region and a surrounding, outer magnetic-alloy region. Each region is successively energized for sputter deposition of material onto the substrate. Media formed by successive sputtering from a two-region target have a higher coercivity than media formed by sputtering the chromium underlayer and the magnetic recording layer from separate targets in two separate sputtering chambers.

Although the invention has been described with respect to particular embodiments, it will be apparent to those skilled in the art that various changes and modifications can be made without departing from the invention.

It is claimed:

1. A method for forming a magnetic recording medium having a nonmagnetic underlayer and a magnetic layer deposited on a substrate, comprising, placing the substrate in a deposition station having a single, two-region target formed of an inner, nonmagnetic region and an outer, magnetic alloy region;

sputtering said underlayer onto the substrate by energizing the inner target region only; and with the substrate in the same deposition station, sputtering said magnetic layer onto the substrate by energizing the outer target region only.

2. The method of claim 1, wherein said sputtering steps are accomplished by applying a DC voltage, in the presence of a magnetic field, successively to each of the two target regions.

3. The method of claim 1, wherein said sputtering steps are accomplished by applying an RF signal successively to each of the two target regions.

4. The method of claim 1, wherein sputtering steps are from a two-region target having an inner, circular chromium region and an outer, annular cobalt-based magnetic alloy region.

5. The method of claim 4, wherein said sputtering steps are accomplished by applying a DC voltage, in the presence of a magnetic field, successively to each of the two target regions.

6. The method of claim 4, wherein said sputtering from the inner region is effective to deposit a chromium underlayer to a thickness of between 50 and 750 Å, and said sputtering from the outer target region is effective to deposit a magnetic recording layer to a thickness of between 50 and 400 Å.

7. The method of claim 4, wherein said sputtering steps are repeated, forming a multilayered magnetic recording medium having a chromium interlayer deposited on the magnetic layer, and a second magnetic layer deposited on the chromium interlayer.

8. The method of claim 5, wherein said sputtering steps are accomplished by applying said DC voltage first to the inner target region, and then to the outer target region.

9. The method of claim 6, wherein said sputtering from the outer target region is from an outer target region composed of CoCrTa.

10. A method for forming a magnetic recording medium having a substrate and, deposited on the substrate, a chromium underlayer and first and second magnetic recording layers separated by a chromium interlayer, comprising, placing the substrate in a deposition station having a single, two-region target formed of an inner, chromium region and an outer, cobalt-based magnetic alloy region;

sputtering said chromium underlayer onto the substrate by energizing the inner target region only;

sputtering said first magnetic layer directly onto the underlayer by energizing the outer target region only;

sputtering said chromium interlayer onto the first magnetic layer by energizing the inner target region only; and sputtering said second magnetic layer onto the chromium interlayer by energizing the outer target region only; wherein said sputtering steps are performed with the substrate in the same deposition station.

* * * * *